United States Patent [19]

Garrett

[11] Patent Number: 5,225,629
[45] Date of Patent: Jul. 6, 1993

[54] SNAP-IN EMI CONTACT ASSOCIATED WITH A DIGITAL COMPUTER

[75] Inventor: Robert H. Garrett, Austin, Tex.
[73] Assignee: Dell USA L.P., Austin, Tex.
[21] Appl. No.: 808,270
[22] Filed: Dec. 13, 1991
[51] Int. Cl.⁵ .............................................. H05K 9/00
[52] U.S. Cl. ................................. 174/35 R; 361/424
[58] Field of Search ............... 24/457, 458, 485, 530, 24/531, 542, 543, 545, 546, 555, 559, 561, 562, 563, 588; 174/35 GC, 35 R, 35 MS, 51; 361/424

[56] References Cited

U.S. PATENT DOCUMENTS 3,877,112  4/1975  Pestka ............................ 24/73 B
4,554,400  11/1985  Schmalzl ..................... 174/35 GC
4,803,306  2/1989  Malmquist .................. 174/35 GC Primary Examiner—Leo P. Picard
Assistant Examiner—B. Lee Ledynh
Attorney, Agent, or Firm—Thomas G. Devine; James W. Huffman

[57] ABSTRACT

To reduce the electro-magnetic interference (EMI) of a digital computer, the EMI contact of this invention is snapped into place in the chassis of the computer and the cover for the computer is then placed over the chassis with the contact surfaces of the EMI contact firmly engaging the cover to provide grounding between the cover and the chassis, thereby reducing EMI.

9 Claims, 3 Drawing Sheets

SNAP-IN EMI CONTACT ASSOCIATED WITH A DIGITAL COMPUTER

BACKGROUND OF THE INVENTION

1. Field of the Invention

This invention relates to a compliant grounding contact between the cover and the chassis of a digital computer. More particularly, it relates to a compliant grounding contact that may be easily snapped into position and which does not interfere with the installation of the cover.

2. Description of the Related Art

In the past, grounding contacts have been mounted around an edge (of a chassis) leaving a free edge which could be caught by the cover when the cover is installed.

Other grounding contacts have been attached by a fastening device (spot weld, adhesive, rivet, screw, etc.). Often the grounding contact is made between a cover and a chassis by drilling holes in the cover and chassis and fastening with screws.

Still other solutions have been to use springs for providing the ground contact, such springs being welded to the chassis. Welding is costly and often can anneal the spring material making plastic deformation of the spring during normal use a problem.

This invention eliminates the problems noted above.

BRIEF SUMMARY OF THE INVENTION

This EMI contact is a snap-in grounding spring with two compliant contacts. The device has two functional parts: the retaining clips and the compliant contact springs. Four cut-outs (apertures) are required in the chassis into which the clip is installed.

The compliant contact springs protrude through the contact apertures and make firm contact with the cover when the cover is in place. The tabs of the retaining clip fit into the retaining apertures.

The parameters of the contact springs can be adjusted to provide the contact force required for the material specified.

There are no protrusions through the chassis wall except for the contact springs, providing a low impedence path to ground without any additional fastening devices.

The principal object of this invention is to provide an effective ground contact between components of a digital computer through the use of an easy-to-install and effective EMI contact.

This and other objects will be made evident in the detailed description that follows:

DETAILED DESCRIPTION OF THE INVENTION

This invention provides a compliant grounding contact between the cover and the chassis of a computer system. The EMI contact of this invention has no protrusions on which the cover might catch during assembly.

The EMI contact is of a top-down snap-in design that combines easy hand or hand-tool assembly with sufficient contact force to provide a low impedance ground path. The snap-in mounting feature provides very secure mechanical attachment and allows removal of the EMI contact without destroying it or the part in which it is mounted. The design of the contacts and spring arms of the EMI contact is flexible, allowing for parameter variation to achieve the desired combination of contact properties. The following detailed description describes the features of this invention that provide the attributes of the EMI contact as described above.

Figure 1:
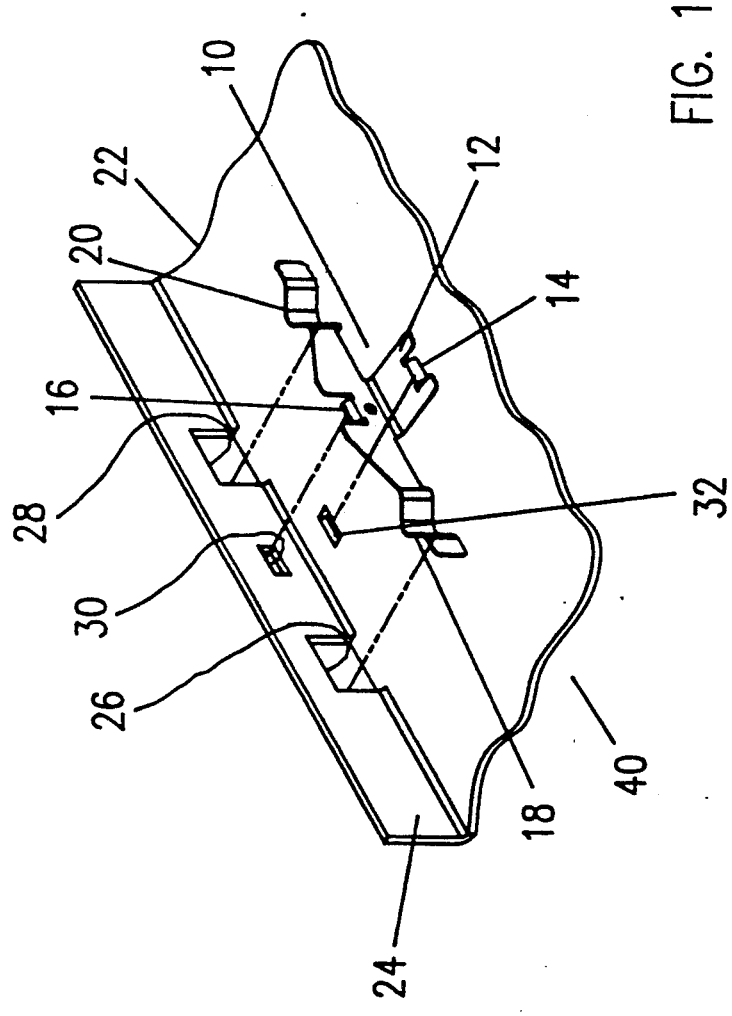
FIG. 1 is an exploded view of the EMI contact as it fits into the chassis of this invention.

FIG. 1 illustrates EMI contact 10 having two compliant contacts 18,20. EMI contact 10 also has a retaining clip 12 which has bottom tab 14 and side tab 16. As shown, chassis 40 has bottom surface 22 and side wall 24. Contact apertures 26 and 28 receive compliant contact springs 18 and 20 respectively, as shown. Bottom tab 14 is received in aperture 32 and side tab 16 is received in aperture 30.

Figure 2:
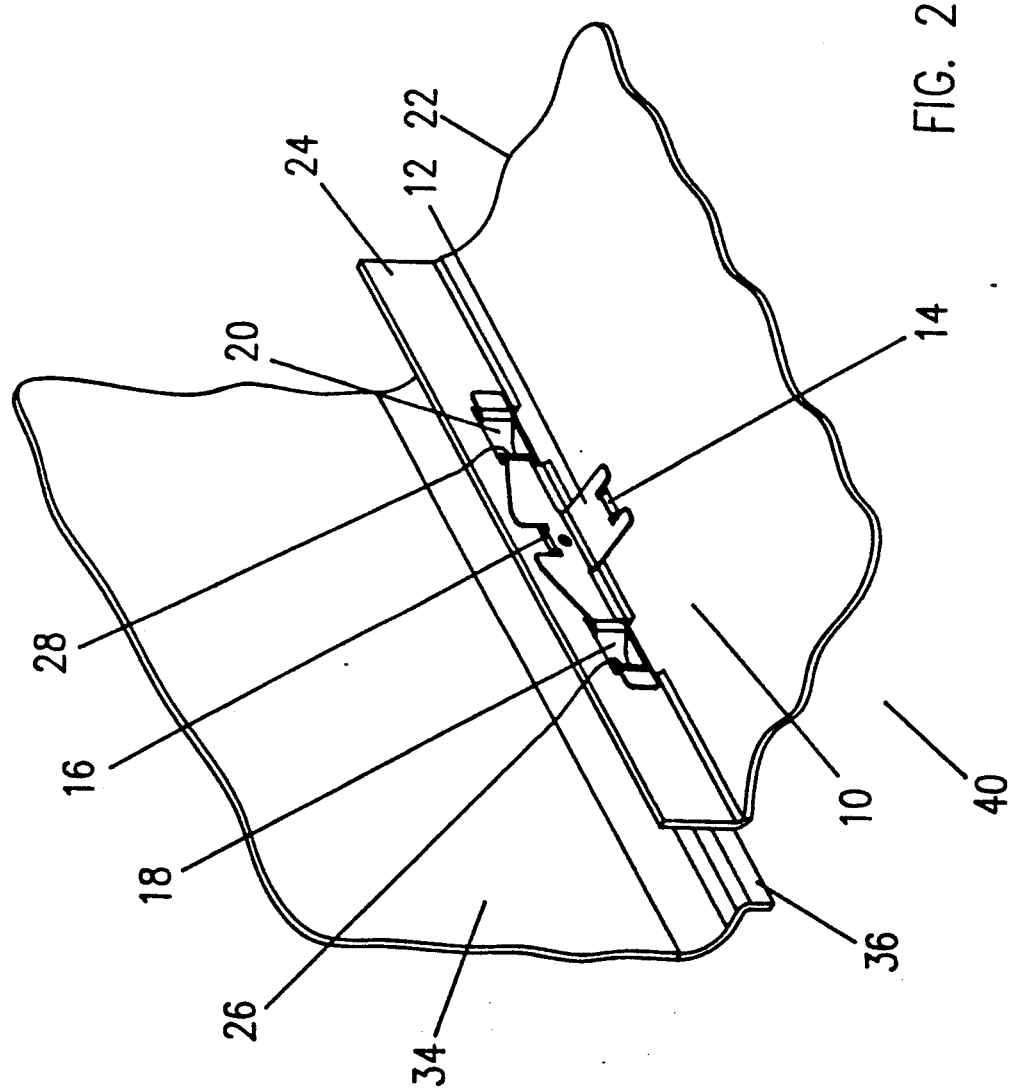
FIG. 2 illustrates the EMI contact, chassis and cover of this invention in place.

FIG. 2 illustrates EMI contact 10 in place in chassis 40. Compliant contact springs 18 and 20 are shown protruding through contact apertures 26 and 28 respectively. Tabs 16 and 14 are shown in place in apertures 30 and 32, respectively. Cover 34, having contact surface 36, is also shown in place with the compliant contact springs 18 and 20 bearing against surface 36.

Figure 3:
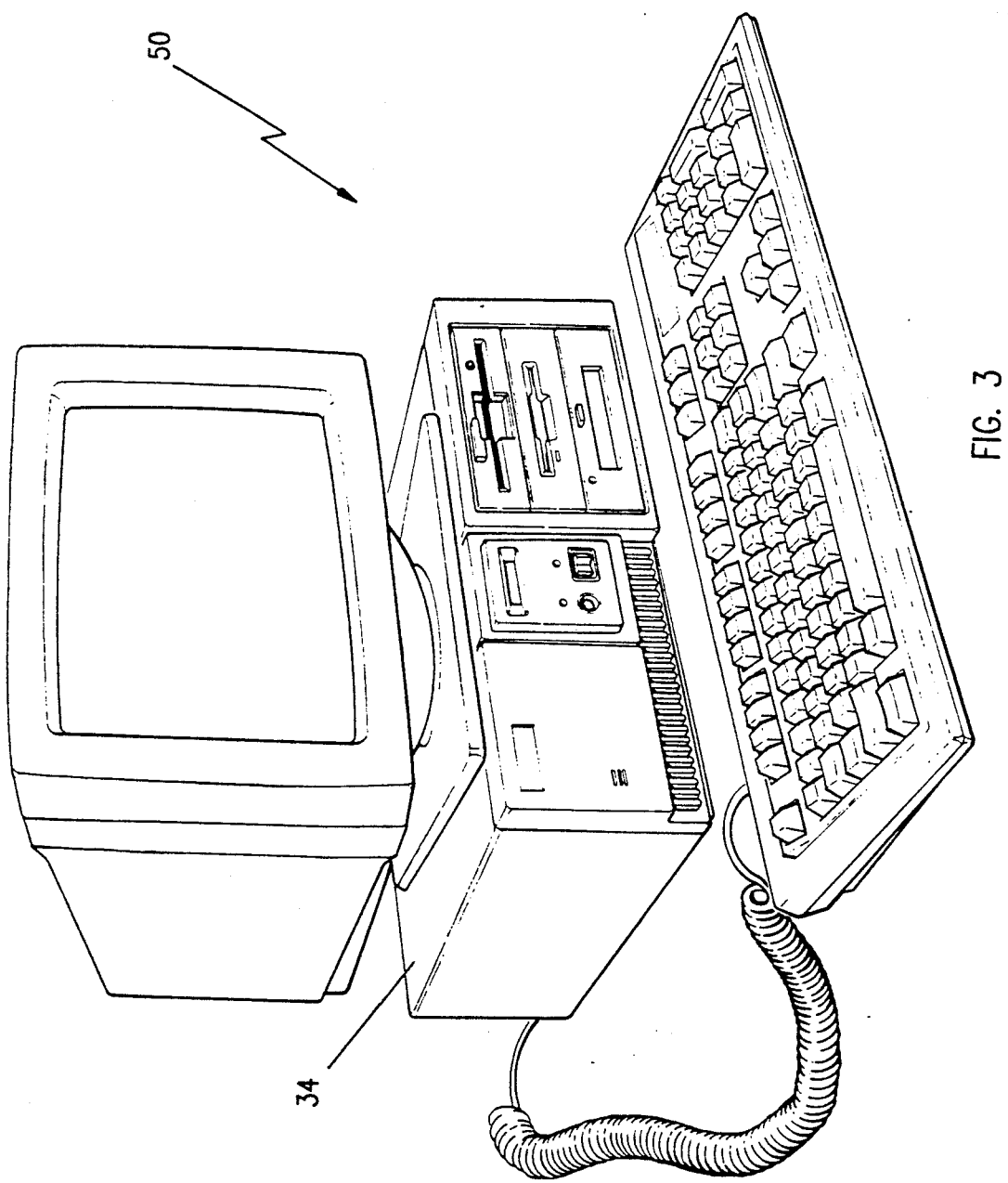
FIG. 3 is a perspective view of the digital computer of this invention.

FIG. 3 shows cover 34 in place on the chassis of digital computer system 50.

MODE OF OPERATION OF THE INVENTION

The EMI contact 10 is simply pushed downwardly into place in chassis 40. The bottom tab 14 is inserted into bottom slot 32 and then compliant contacts spring 18 and 20 snap into position in contact apertures 26 and 28, respectively. Then tab 16 fits into retaining aperture 30.

In a typical installation, a plurality of EMI contacts 10 are employed to ensure a good ground contact between chassis 40 and cover 34. The number of EMI contact depends, of course, upon the dimensions of chassis 40 and cover 34.

It is certainly within a competent designer's skill to alter the appearance of the EMI contact 10 through the use of a single compliant contact spring, for example. Such alterations and changes may of course be made, but are anticipated by the invention which is only limited as defined in the appended claims.

What is claimed is:

1. A digital computer, comprising:
   (a) a chassis, having at least one contact aperture and a retaining fixture;
   (b) a cover, fitting over the chassis; and
   (c) at least one electro-magnetic interference (EMI) contact, having a retaining clip for engaging the retaining fixture, and a contact surface that protrudes through the contact aperture and contacts the cover, to provide grounding between the cover and the chassis, thereby reducing EMI.

2. The computer of claim 1 wherein the chassis comprises a bottom surface and at least one side wall.

3. The computer of claim 2 wherein the retaining fixture comprises a retaining aperture in the side wall and a retaining aperture in the bottom surface.

4. The computer of claim 3 wherein the retaining clip comprises a first tab for insertion into the retaining aperture in the side wall, and a second tab for insertion into the retaining aperture in the bottom surface.

5. The computer of claim 4 wherein the chassis has two contact apertures, both located in the side wall.

6. The computer of claim 5 wherein the EMI contact has two contact surfaces, protruding through the two contact apertures, respectively, and contacting the cover.

7. The computer of claim 6 wherein the EMI contact is made of a resilient, conductive material.

8. The computer of claim 6 wherein the EMI contact is formed of a metallic spring material.

9. The computer of claim 8 wherein each of the two contact surfaces is formed in a convex arc to allow easy sliding of the cover into position over the chassis.

* * * * *